United States Patent
Zhai et al.

(10) Patent No.: US 10,062,856 B1
(45) Date of Patent: Aug. 28, 2018

(54) FLEXIBLE DISPLAY SUBSTRATE AND FLEXIBLE DISPLAY APPARATUS

(71) Applicant: Shanghai Tianma Micro-Electronics Co., Ltd., Shanghai (CN)

(72) Inventors: Yingteng Zhai, Shanghai (CN); Yong Wu, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 0 days.

(21) Appl. No.: 15/634,816

(22) Filed: Jun. 27, 2017

(30) Foreign Application Priority Data

Feb. 28, 2017 (CN) .......................... 2017 1 0112947

(51) Int. Cl.
   *H01L 51/00* (2006.01)
   *H01L 27/32* (2006.01)

(52) U.S. Cl.
   CPC ........ *H01L 51/0097* (2013.01); *H01L 27/323* (2013.01); *H01L 27/3276* (2013.01)

(58) Field of Classification Search
   None
   See application file for complete search history.

(56) References Cited

U.S. PATENT DOCUMENTS

| 2014/0176494 A1* | 6/2014 | Huang | G02F 1/13338 345/174 |
| 2014/0254111 A1* | 9/2014 | Yamazaki | H01L 51/0097 361/749 |
| 2017/0098668 A1* | 4/2017 | Huitema | H01L 27/1244 |

FOREIGN PATENT DOCUMENTS

CN   103427041 A1   12/2013

OTHER PUBLICATIONS

Table of Resistivity, downloaded from URL at < http://hyperphysics.phy-astr.gsu.edu/hbase/Tables/rstiv.html> on Jan. 29, 2018.*

* cited by examiner

*Primary Examiner* — Joseph Schoenholtz
(74) *Attorney, Agent, or Firm* — Miller, Matthias & Hull LLP

(57) ABSTRACT

A flexible display substrate and a flexible display apparatus are provided. The flexible display substrate has a display region including a plurality of pixel units and a peripheral region adjacent to the display region. The flexible display substrate includes a substrate and at least one conductive wire disposed on the substrate, each conductive wire includes at least two first conductive portions and at least one second conductive portion, and two adjacent first conductive portions are electrically connected through the second conductive portion. The Young's modulus of the first conductive portions is greater than that of the second conductive portion, and the resistivity of the first conductive portions is less than that of the second conductive portion.

19 Claims, 11 Drawing Sheets

FLEXIBLE DISPLAY SUBSTRATE AND FLEXIBLE DISPLAY APPARATUS

CROSS REFERENCE TO RELATED APPLICATIONS

This application claims priority under 35 USC § 119 to Chinese Patent Application No. CN201710112947.5 filed on Feb. 28, 2017, the disclosure of which is incorporated herein by reference in its entirety.

TECHNICAL FIELD

The present disclosure relates to the display field, and more particularly to a flexible display substrate and a flexible display apparatus.

BACKGROUND

A flexible display apparatus is bendable and deformable and can be applied to various fields such as a wearable device, a mobile phone and an electronic book, including a flexible organic electroluminescent display apparatus, a flexible electrophoretic display apparatus, a flexible liquid crystal display apparatus, and the like.

FIG. 1 is a schematic plan diagram showing a flexible display substrate according to the related art, and FIG. 1a is a schematic cross-sectional diagram of the flexible display substrate shown in FIG. 1. In combination with FIG. 1 and FIG. 1a, the flexible display apparatus includes a flexible substrate 01 made of a bendable flexible material such as plastics, so that the display apparatus is bendable. A wire 02 for transmitting an electrical signal is disposed on the flexible substrate 01.

Reference is made to FIG. 1b, which is a schematic diagram showing the flexible display substrate of FIG. 1a being in a stressed state. The flexible display apparatus is deformed due to bending under an action of a force F1 when being used. The deformation amount of the wire 02 is greater and the stress is relatively concentrated at a region A, and thus the wire 02 is liable to break at the region A when the flexible display apparatus deforms repeatedly under the action of the force F1, causing an open circuit. Therefore, a normal operation of the flexible display apparatus is affected.

SUMMARY

In view of the above, the present disclosure provides a flexible display substrate and a flexible display apparatus.

The present disclosure provides a flexible display substrate. The flexible display substrate has a display region including a plurality of pixel units and a peripheral region adjacent to the display region. The flexible display substrate further includes a substrate and at least one conductive wire disposed on the substrate. Each conductive wire includes at least two first conductive portions and at least one second conductive portion, and two adjacent first conductive portions are electrically connected through the second conductive portion. A current of a first conductive portion flows into another first conductive portion adjacent to the first conductive portion through the second conductive portion electrically connected with the first conductive portion. The Young's modulus of the first conductive portions is greater than that of the second conductive portion, and the resistivity of the first conductive portions is less than that of the second conductive portion.

The present disclosure further provides a flexible display apparatus including a flexible display substrate and a housing, where the flexible display substrate has a display region including a plurality of pixel units and a peripheral region adjacent to the display region. The flexible display substrate further includes a substrate and at least one conductive wire disposed on the substrate. The conductive wire includes at least two first conductive portions and at least one second conductive portion, wherein two adjacent first conductive portions are electrically connected through the second conductive portion, and wherein the Young's modulus of the first conductive portions is greater than that of the second conductive portion, and the resistivity of the first conductive portions is less than that of the second conductive portion.

Compared with the related art, the present disclosure has at least one of the outstanding advantages described below.

In the flexible display substrate of the present disclosure, each conductive wire includes at least two first conductive portions and at least one second conductive portion, and two adjacent first conductive portions are electrically connected through the second conductive portion; the resistivity of the first conductive portions is less than that of the second conductive portion. In other words, when an electrical signal is transmitted through the conductive wire, the current flows from a first conductive portion to another conductive portion adjacent to the first conductive portion through the second conductive portion electrically connected with the first conductive portion. Since the Young's modulus of the first conductive portions is greater than that of the second conductive portion, the deformation of the conductive wire is mainly concentrated on the second conductive portion with less the Young's modulus in a state where the flexible display substrate is bent and deformed. Compared with the first conductive portions, the second conductive portion is less likely to break due to the smaller the Young's modulus. Compared with the related art, in the flexible display substrate provided by the present disclosure, the first conductive portions with smaller resistivity can be used for the conductive wire, and thus the loss occurred during the transmission of the electrical signal can be reduced. Meanwhile, two adjacent first conductive portions are connected through the second conductive portion with smaller the Young's modulus, the bending stress is concentrated on the second conductive portion, and the conductive wire is less likely to break, and thus the bending resistance of the flexible display substrate is improved, the deformation amount which may be withstood by the flexible display substrate is increased, and the service life of the flexible display substrate is prolonged.

DETAILED DESCRIPTION

The foregoing objectives, features and advantages of the present disclosure will become more apparent from the following description of the present disclosure when taken in conjunction with the accompanying drawings and embodiments.

It is to be noted that specific details are set forth in the following description so as to fully understand the present disclosure. However, the present disclosure may be implemented in multiple manners otherwise than that specifically described herein, and may be popularized by those skilled in the art without departing from the spirit of the present disclosure. Accordingly, the present disclosure is not limited to the detailed description disclosed below.

Figure 1:
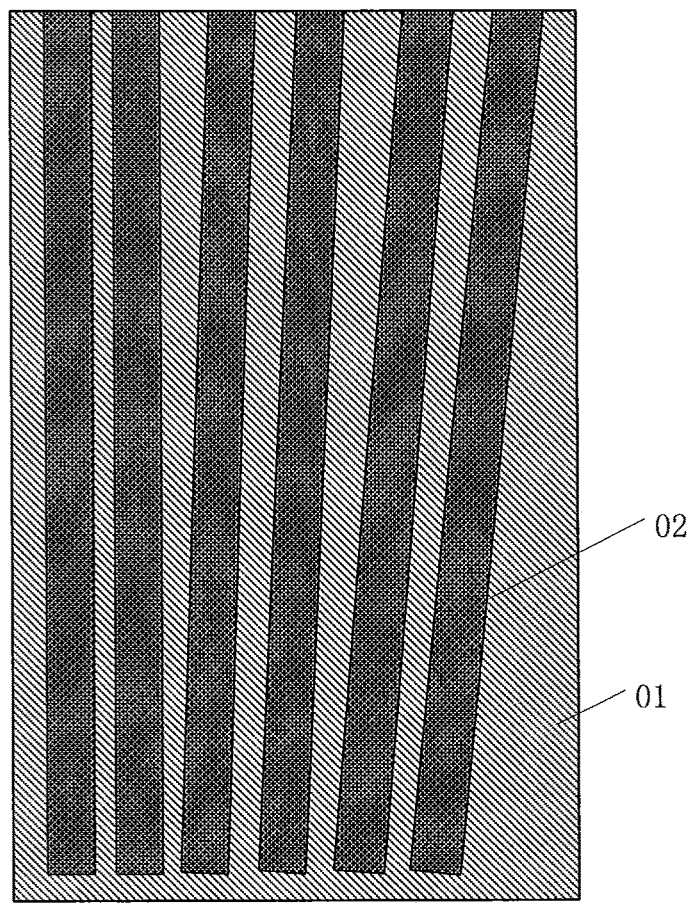
FIG. 1 is a schematic plan diagram showing a flexible display substrate according to the related art.
Figure 1A:
FIG. 1a is a schematic cross-sectional diagram of the flexible display substrate shown in FIG. 1.
Figure 1B:
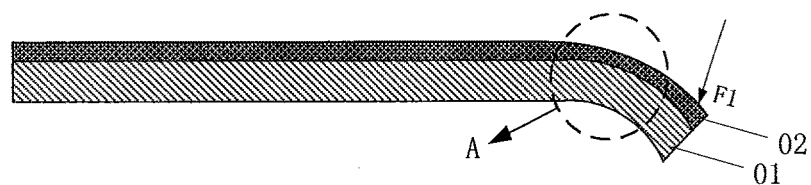
FIG. 1b is a schematic cross-sectional diagram showing the flexible display substrate shown in FIG. 1a being in a stressed state.
Figure 2:
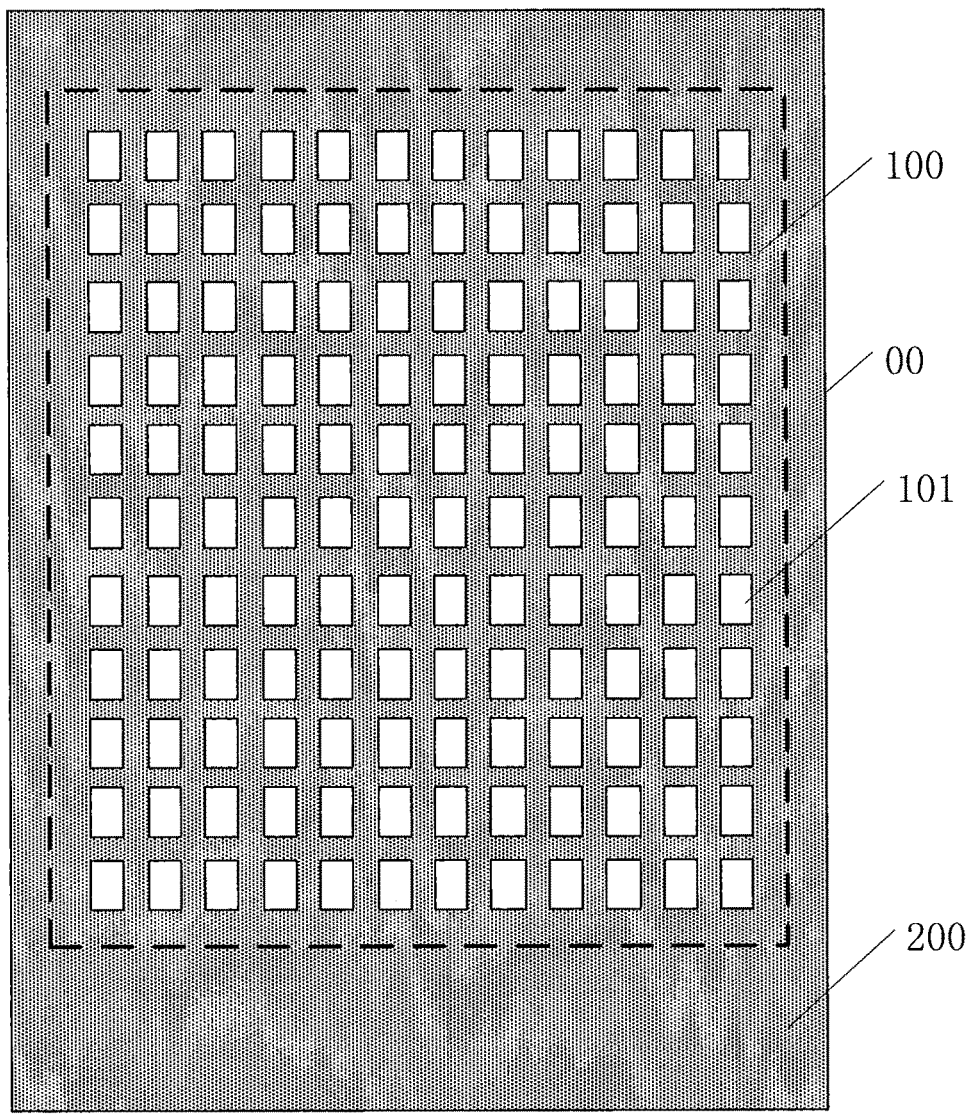
FIG. 2 is a schematic plan diagram showing a flexible display substrate according to an embodiment of the present disclosure.
Figure 3:
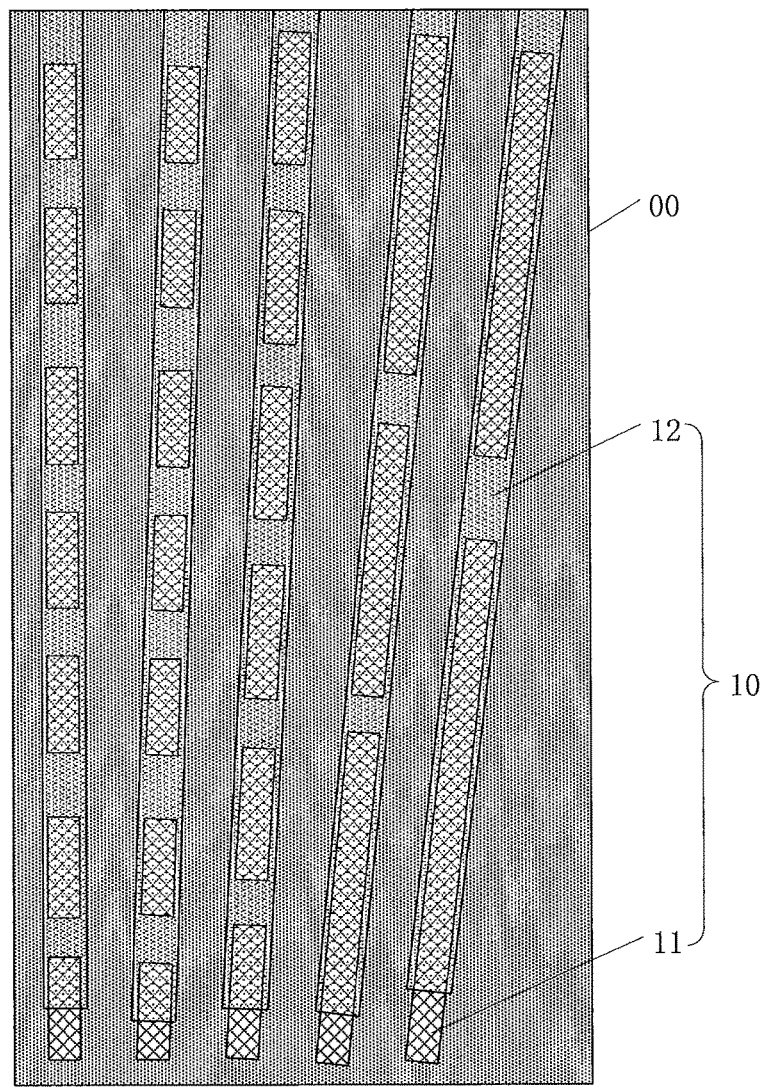
FIG. 3 is a partial schematic plan diagram showing the flexible display substrate according to the embodiment of FIG. 2.
Figure 3A:
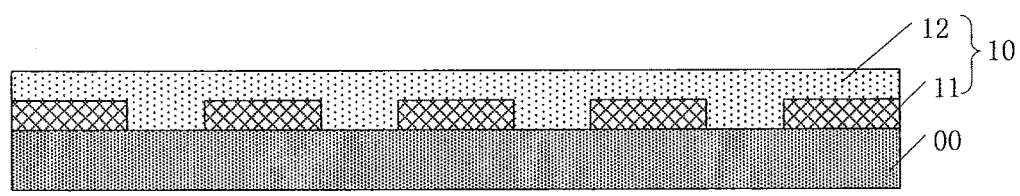
FIG. 3a is a schematic cross-sectional diagram showing the flexible display substrate shown in FIG. 3.

With reference to FIG. 2, FIG. 3 and FIG. 3a, FIG. 2 is a schematic plan diagram showing a flexible display substrate according to an embodiment of the present disclosure, FIG. 3 is a partial schematic plan diagram showing the flexible display substrate shown in FIG. 2, and FIG. 3a a schematic cross-sectional diagram showing the flexible display substrate shown in FIG. 3.

As shown in FIG. 2, the flexible display substrate has a display region 100 including a plurality of pixel units 101 and a peripheral region 200 adjacent to the display region 100. The flexible display substrate further includes a substrate 00. As shown in FIG. 3 and FIG. 3a, the flexible display substrate provided by the present embodiment further includes at least one conductive wire 10 disposed on the substrate 00. The conductive wire 10 includes at least two first conductive portions 11 and at least one second conductive portion 12. Two adjacent first conductive portions 11 are electrically connected by the second conductive portion 10, where the Young's modulus of the first conductive portions 11 is greater than that of the second conductive portion 12, and the resistivity of the first conductive portions 11 is less than that of the second conductive portion 12.

In the flexible display substrate provided by the present embodiment, each of the conductive wires 10 is used for transmitting an electrical signal, for example, an electrical signal with a constant voltage or a pulse electrical signal, which is not particularly limited in the present embodiment. Extending directions of the conductive wires 10 may be parallel to each other or may intersect with each other, lengths of the conductive wires 10 may be the same or not exactly the same, line widths of the conductive wires 10 may be the same or not exactly the same, which are not particularly limited in the present embodiment. The conductive wire 10 includes at least two first conductive portions 11 and at least one second conductive portion 12, where the first conductive portions are disposed discontinuously and separate from each other, and two adjacent first conductive portions 11 are electrically connected by the second conductive portion 12. Since the resistivity of the first conductive portion 11 is less than that of the second conductive portion 12, when an electrical signal is transmitted through the conductive wire 10, a current preferentially flows in the first conductive portion 11 with a less resistivity, and then flows into the adjacent first conductive portion 11 through the second conductive portion 12. As can be seen, when an electrical signal is transmitted through the conductive wire 10 provided by the present embodiment, the current may sequentially flow through adjacent first conductive portions 11.

In the flexible display substrate provided by the present disclosure, the resistivity and the bending resistance of the conductive wire are considered. Specifically, the first conductive portions with less resistivity are adopted to reduce a loss occurring during the transmission of the electrical signal. Meanwhile, the second conductive portion with less Young's modulus is adopted to connect two adjacent first conductive portions, and the bending stress is concentrated on the second conductive portion, so that the conductive wire is less likely to break. Therefore, the bending resistance of the flexible display substrate is improved, the deformation amount which may be withstood by the flexible display substrate is increased, and the service life of the flexible display substrate is prolonged.

Figure 3B:
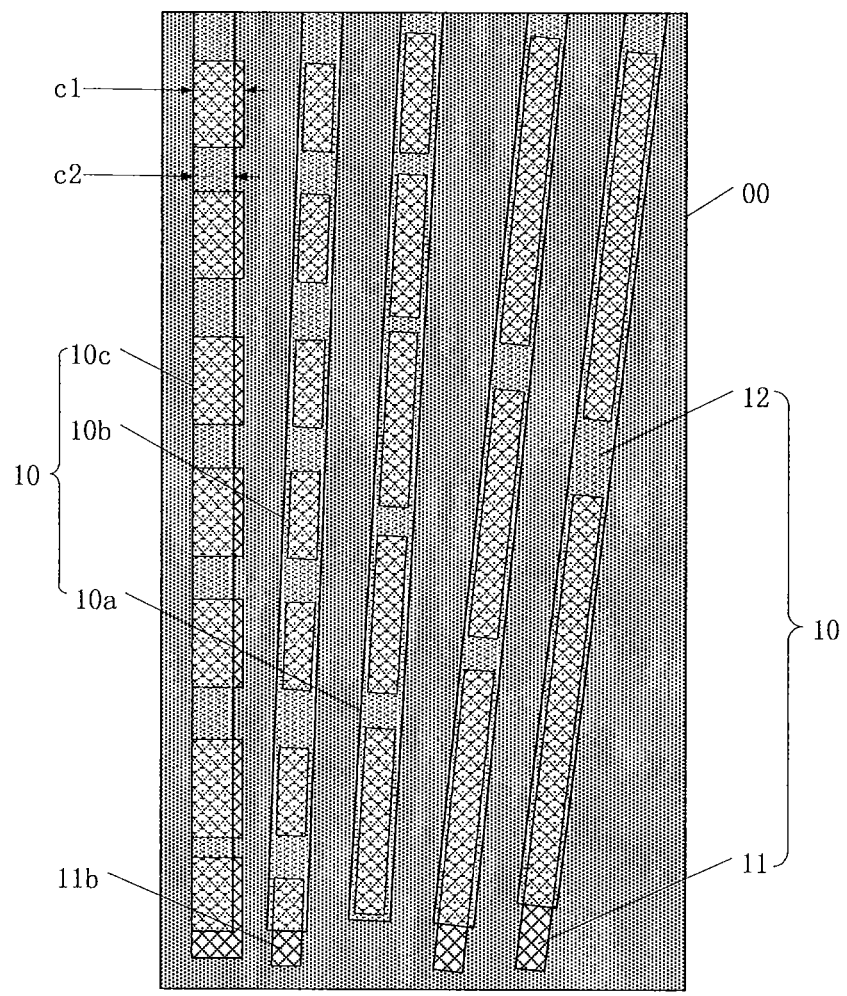
FIG. 3b is another partial schematic plan diagram showing the flexible display substrate according to the embodiment of FIG. 2.

In some alternative implementations, in the flexible display substrate shown in FIG. 3 and FIG. 3a, there is one second conductive portion 12, which is disposed on a side, which is facing away from the substrate 00, of the first conductive portions 11 and covers at least two first conductive portions 11. In other words, the second conductive portion 12 covers the first conductive portions 11 as a whole, and the first conductive portions 11 in the conductive wire are all electrically connected with the second conductive portion 12, and the surface at the side, which is facing away from the substrate 00, of each of the first conductive portions 11 in the conductive wire is covered by the second conductive portion 12. With reference to FIG. 3b, it is to be noted that the first conductive portions 11 may be partially covered or entirely covered by the second conductive portion 12. Similar parts in FIG. 3b adopt the same reference numerals as that used in FIG. 3, which will be omitted herein. In the former case, the first conductive portions may be partially covered by the second conductive portion, for example, the first conductive portion 11b located at an end of the conductive wire 10b is partially covered by the second conductive portion. As another example, the width c2 of the second conductive portion may be slightly less than the width c1 of the first conductive portions, and portions of the first conductive portions, where the first conductive portions are wider than the second conductive portion, are not covered by the second conductive portion. In the latter case, for example, as shown by the conductive wire 10a in FIG. 3b, the first conductive portions may be entirely covered by the second conductive portion. Alternatively, the width of the second conductive portion 12 may be greater than that of the first conductive portions 11. In other alternative implementations, the width of the second conductive portion 12 may be equal to or less than that of the first conductive portion 11, where the width of the first conductive portion and the width of the second conductive portion may be understood as a length for which the first conductive portions extend along a direction perpendicular to the extending direction of the conductive wire and a length for which the second conductive portion extends along a direction perpendicular to the extending direction of the conductive wire.

Figure 4:
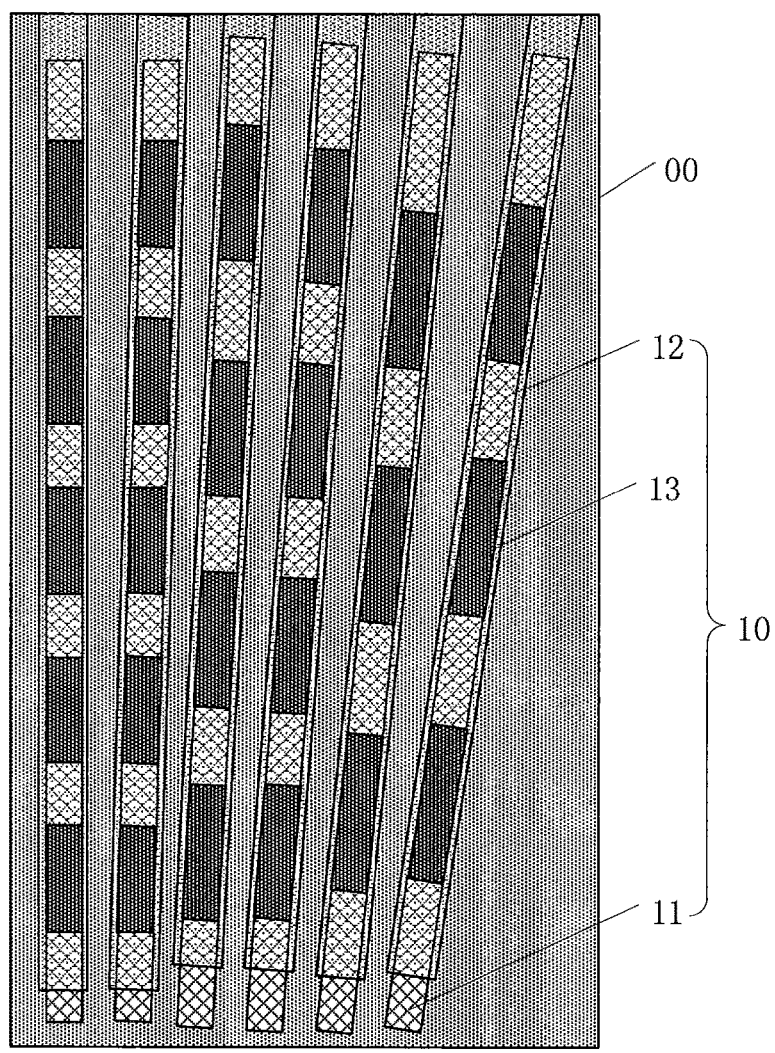
FIG. 4 is a further partial schematic plan diagram showing the flexible display substrate according to the embodiment of FIG. 2.
Figure 4A:
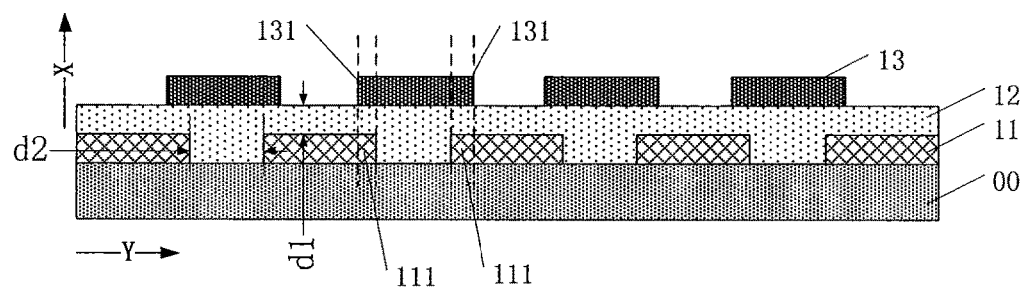
FIG. 4a is a schematic cross-sectional diagram showing the flexible display substrate shown in FIG. 4.

In some alternative implementations, reference is made to FIG. 4 and FIG. 4a. FIG. 4 is a further partial schematic plan diagram of the flexible display substrate as shown in FIG. 2, and FIG. 4a is a schematic cross-sectional diagram of the flexible display substrate as shown in FIG. 4. As shown in FIG. 4 and FIG. 4a, the flexible display substrate provided by the present embodiment includes at least one conductive wire 10 disposed on the substrate 00, where the conductive wire 10 includes at least two first conductive portions 11 and at least one second conductive portion 12, and two adjacent first conductive portions 11 are electrically connected by the second conductive portion 12. The Young's modulus of the first conductive portions 11 is greater than that of the second conductive portion 12, and the resistivity of the first conductive portions 11 is less than that of the second conductive portion 12. The flexible display substrate provided by the present embodiment further includes at least one third conductive portion 13. The third conductive portion 13 is disposed on a surface, which is facing away from the first conductive portions 11, of the second conductive portion 12, the Young's modulus of the third conductive portion 13 is greater than that of the second conductive portion 12, and the resistivity of the third conductive portion 13 is less than that of the second conductive portion 12. Each of the third conductive portions 13 is intersected with two adjacent first conductive portions 11 in a direction perpendicular to the substrate 00. The third conductive portion 13 includes third intersecting portions 131 intersected with the first conductive portions 11, and the first conductive portions 11 include first intersecting portions 111 intersected with the third conductive portion 13. The second conductive portion 12 disposed between the third conductive portion 13 and the first conductive portion 11 intersected with the third conductive portion 13 has a thickness d1 in a direction perpendicular to the substrate 00, and the second conductive portion 12 disposed between two adjacent first conductive portions 11 has a thickness d2 in a direction parallel to the substrate 00, where d1 is less than d2. Here, the direction perpendicular to the substrate 00 is referred to as an X direction in FIG. 4a, and the direction parallel to the substrate 00 is referred to as a Y direction in FIG. 4a. It is to be noted that in the present embodiment, in the direction perpendicular to the substrate 00, each third conductive portion 13 is intersected with two adjacent first conductive portions 11, where intersecting can be understood to mean an orthographic projection of the third conductive portion 13 on the substrate 00 partially overlaps with orthographic projections of two adjacent first conductive portions 11 on the substrate 00. Alternatively, in the flexible display substrate provided by the present embodiment, a material of the third conductive portion 13 is the same as that of the first conductive portions 11.

It is to be noted that, since d1 is less than d2 and the resistivity of the third conductive portion 13 is less than that of the second conductive portion 12, when the current flows through the conductive wire 10, a part of the current may flow from a first conductive portion 11 to a third conductive portion 13 intersected with the first conductive portion 11 through a second conductive portion 11 electrically connected with the first conductive portion 11, and then flow from the third conductive portion 13 to another first conductive portion 11 intersected with the third conductive portion 13 through the second conductive portion 12; and the other part of the current may flow from the first conductive portion 11 to another first conductive portion 11 adjacent to the first conductive portion 11 through the second conductive portion 12 electrically connected with the first conductive portion 11. In the flexible display substrate provided by the present embodiment, the conductive wire 10 includes the first conductive portions 11, the second conductive portion 12, and the third conductive portions 13, where the first conductive portions 11 and the third conductive portion 13 form a parallel structure, so that an equivalent resistance of the conductive wire 10 may be reduced.

Figure 5:
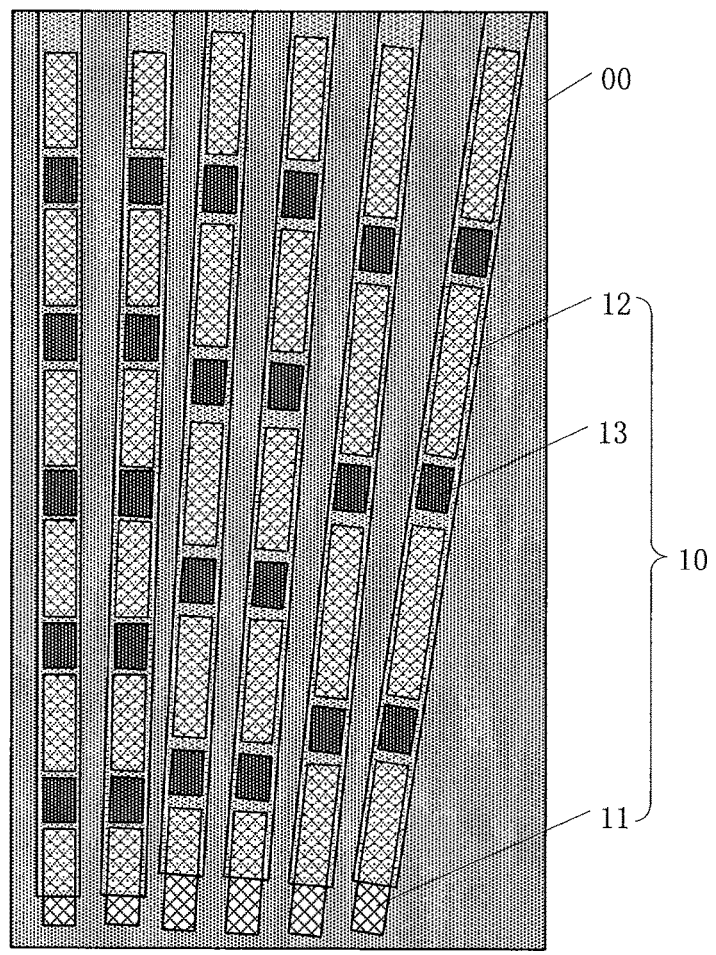
FIG. 5 is another partial schematic plan diagram showing the flexible display substrate shown in FIG. 2.
Figure 5A:
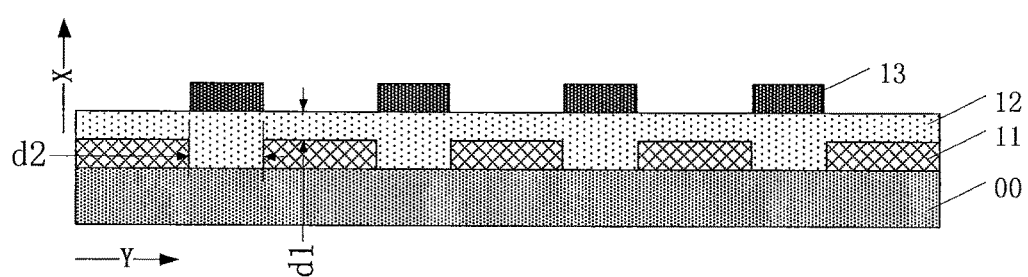
FIG. 5a is a schematic cross-sectional diagram showing the flexible display substrate shown in FIG. 5.

In some alternative implementations, reference is made to FIG. 5 and FIG. 5a. FIG. 5 is another partial schematic plan diagram of the flexible display substrate as shown in FIG. 2, and FIG. 5a is a schematic cross-sectional diagram showing the flexible display substrate as shown in FIG. 5. As shown in FIG. 5 and FIG. 5a, the flexible display substrate provided by the present embodiment includes at least one conductive wire 10 disposed on the substrate 00. Each of the conductive wire 10 includes at least two first conductive portions 11 and at least one second conductive portion 12, and two adjacent first conductive portions 11 are electrically connected through the second conductive portion 12. The Young's modulus of the first conductive portions 11 is greater than that of the second conductive portion 12, and the resistivity of the first conductive portions 11 is less than that of the second conductive portion 12. The flexible display substrate provided by the present embodiment further includes at least one third conductive portion 13 disposed on a surface at the side, which is facing away from the first conductive portions 11, of the second conductive portion 12. The Young's modulus of the third conductive portion 13 is greater than that of the second conductive portion 12, and the resistivity of the third conductive portion 13 is less than that of the second conductive portion 12. An orthographic projection of the third conductive portion 13 on the substrate 00 is between orthographic projections of two adjacent first conductive portions 11 on the substrate 00. The second conductive portion 12 disposed between the third conductive portion 13 and the first conductive portion 11 adjacent to the third conductive portion 13 has a thickness d1 in the direction perpendicular to the substrate 00, and the second conductive portion 12 disposed between two adjacent first conductive portions 11 has a thickness d2 in the direction parallel to the substrate 00, where d1 is less than d2. Here, the direction perpendicular to the substrate 00 is referred to as an X direction in FIG. 5a, and the direction parallel to the substrate 00 is referred to as a Y direction in FIG. 5a. Alternatively, in the flexible display substrate provided by the present embodiment, a material of the third conductive portion 13 is the same as that of the first conductive portions 11.

In the flexible display substrate provided by the present embodiment, since d1 is less than d2 and the resistivity of the third conductive portion 13 is less than that of the second conductive portion 12, when the current flows through the conductive wire 10, a part of the current may flow from a first conductive portion 11 to a third conductive portion 13 adjacent to the first conductive portion 11 through a second conductive portion 12 electrically connected with the first conductive portion 11, and then flow from the third conductive portion 13 to another first conductive portion 11 adjacent to the third conductive portion 13 through the second conductive portion 12; and the other part of the current flows from the first conductive portions 11 to another first conductive portion 11 adjacent to the first conductive portion 11 through the second conductive portion 12 electrically connected with the first conductive portion 11. Here, the first conductive portion 11 and the third conductive portion 13 form a parallel structure, so that an equivalent resistance of the conductive wire 10 may be reduced. An orthographic projection of the third conductive portion 13 on the substrate 00 is between orthographic projections of two adjacent first conductive portions 11 on the substrate 00, that is, the third conductive portion 13 is not intersected with the first conductive portions 11. Therefore, the conductive wire 10 is easy to bend and deform, and thus the deformation amount which may be withstood by the flexible display substrate is increased.

Figure 6:
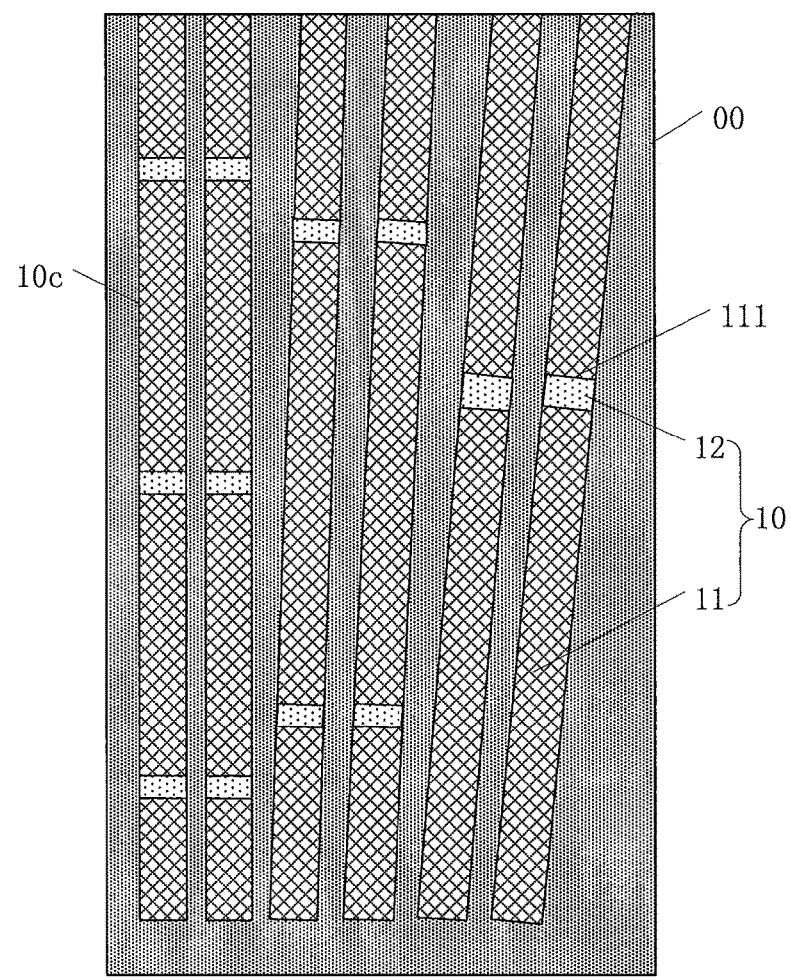
FIG. 6 is another partial schematic plan diagram showing the flexible display substrate shown in FIG. 2.
Figure 6A:
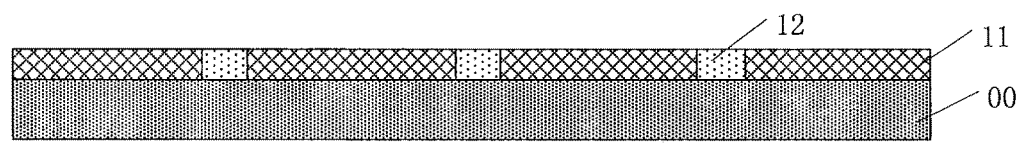
FIG. 6a is a schematic cross-sectional diagram showing the flexible display substrate shown in FIG. 6.

In some alternative implementations, reference is made to FIG. 6 and FIG. 6a. FIG. 6 is another partial schematic plan diagram showing the flexible display substrate as shown in FIG. 2, and FIG. 6a is a schematic cross-sectional diagram of the flexible display substrate as shown in FIG. 6. As shown in FIG. 6 and FIG. 6a, the flexible display substrate provided by the present embodiment includes at least one conductive wire 10 disposed on the substrate 00. Each conductive wire 10 includes at least two first conductive portions 11 and at least one second conductive portion 12, and two adjacent first conductive portions 11 are electrically connected through the second conductive portion 12. The Young's modulus of the first conductive portions 11 is greater than that of the second conductive portion 12, and the resistivity of the first conductive portions 11 is less than that of the second conductive portion 12, where each second conductive portion 12 is electrically connected with two adjacent first conductive portions 11 and is insulated from other first conductive portions 11. Alternatively, with reference to the conductive wire 10c shown in FIG. 6, the conductive wire 10 includes a plurality of first conductive portions 11 and a plurality of second conductive portions 12. In the flexible display substrate provided by the present embodiment, the first conductive portions 11 are disposed discontinuously and separated from each other, and the second conductive portions 12 are disposed discontinuously and separated from each other.

In some alternative implementations, for example, in the flexible display substrate provided by the embodiment of FIG. 6, each first conductive portion 11 includes at least one conductive contact surface 111 that is in contact with the second conductive portion 12. In the present embodiment, the conductive contact surface 111 is a region where the first conductive portion 11 is in contact with the second conductive portion 12. If the first conductive portion 11 includes a cross section in which only a part of the cross section is in contact with the second conductive portion 12, the conductive contact surface 111 refers to the part, which is in contact with the second conductive portion 12, of the cross section, rather than the entire cross section. Alternatively, areas of the conductive contact surfaces 111 of at least two first conductive portions 11 in the conductive wire 10 are equal or unequal. That is, in the same conductive wire 10, the areas of the conductive contact surfaces 111 are equal or unequal.

Figure 7:
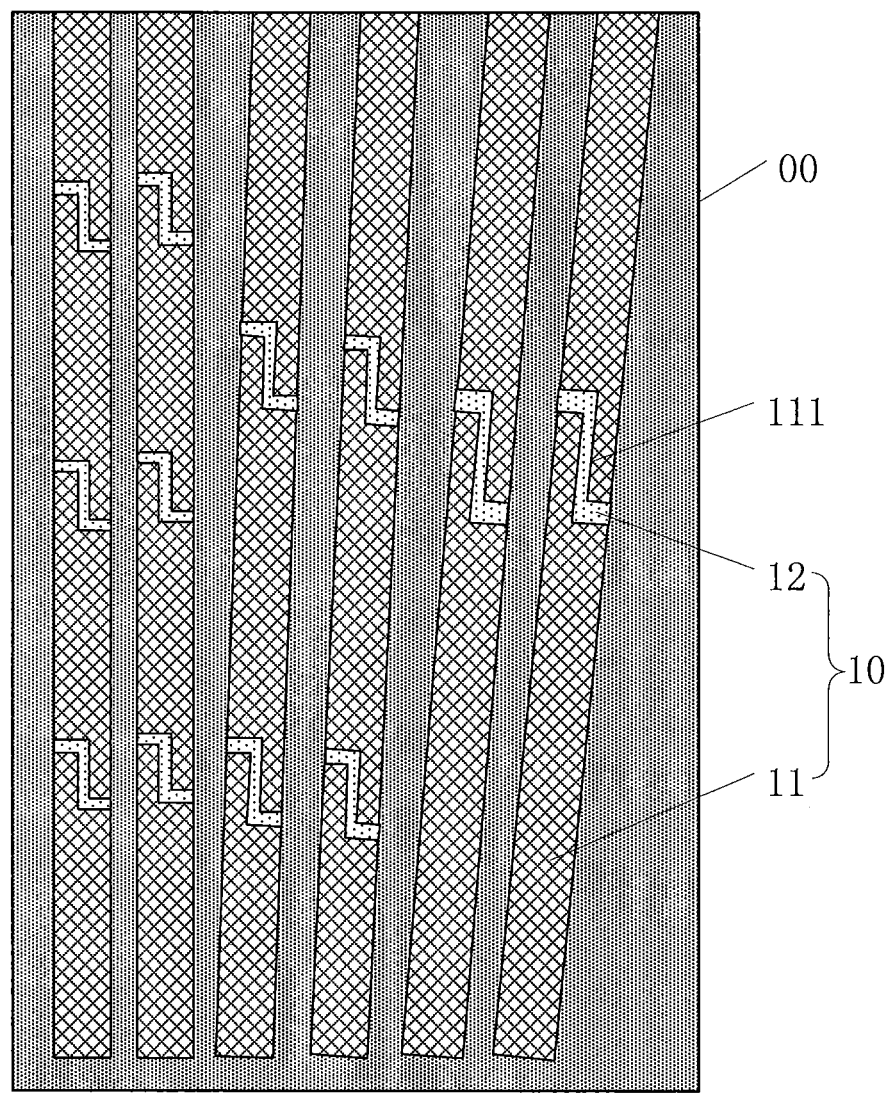
FIG. 7 is another partial schematic plan diagram showing the flexible display substrate shown in FIG. 2.

Alternatively, in the same conductive wire 10, the areas of the conductive contact surface 111 are equal, while among different conductive wires 10, areas of the conductive contact surfaces 111 are unequal. It is to be noted that the areas of the conductive contact surfaces 111 are one of the factors that affect the equivalent resistance of the conductive wires 10. For example, if two conductive wires 10 are the same in the number, the length and the cross-sectional area of the first conductive portion 11 and the like and are the same in the number and the length of the second conductive portion 12, and differ from each other merely in the areas of the conductive contact surfaces 111, the equivalent resistance of the conductive wire 10 having the conductive contact surface 111 with a greater area is smaller. Therefore, in the flexible display substrate provided by the present embodiment, the equivalent resistance of the conductive wire 10 can be adjusted by adjusting the area of the conductive contact surface 111. It is to be noted that in the embodiment provided by FIG. 6, the shape of the conductive contact surface 111 is a flat surface. In the flexible display substrate provided by the embodiments of the present disclosure, the shape of the conductive contact surface 111 is not particularly limited, and the shape of the conductive contact surface 111 may be a rectangular flat surface, a trapezoidal flat surface, a curved surface, a folded surface and so on. Reference is made to FIG. 7, which is another partial schematic diagram showing the flexible display substrate as shown in FIG. 2. Reference numerals similar to that in FIG. 6 are used in FIG. 7, and the similar parts are omitted. The difference between FIG. 7 and FIG. 6 lies in: in the embodiment of FIG. 7, the shape of the conductive contact surface 111 is a folded surface. The conductive contact surface 111 with the folded surface shape contributes to increasing the area of the conductive contact surface 111 and reducing the equivalent resistance of the conductive wire 10.

In addition, in the flexible display substrate provided by the embodiments of the present disclosure, the equivalent resistance of the conductive wire 10 can be adjusted by setting the parameters such as the number, the length, and the cross-sectional area of the first conductive portions 11, or can be adjusted by setting the parameters such as the number, the length, the cross-sectional area, and the like of the second conductive portion 12. Alternatively, in the flexible display substrate provided by the embodiments of the present disclosure, the equivalent resistances of the plurality of conductive wires 10 are equal. Since the equivalent resistances of the plurality of conductive wires 10 are equal, the time it takes for the electrical signal being transmitted in the plurality of conductive wires 10 and the voltage losses during the process are substantially the same, and the signal transmission performance of the conductive wires of the flexible display substrate can be improved.

Figure 8:
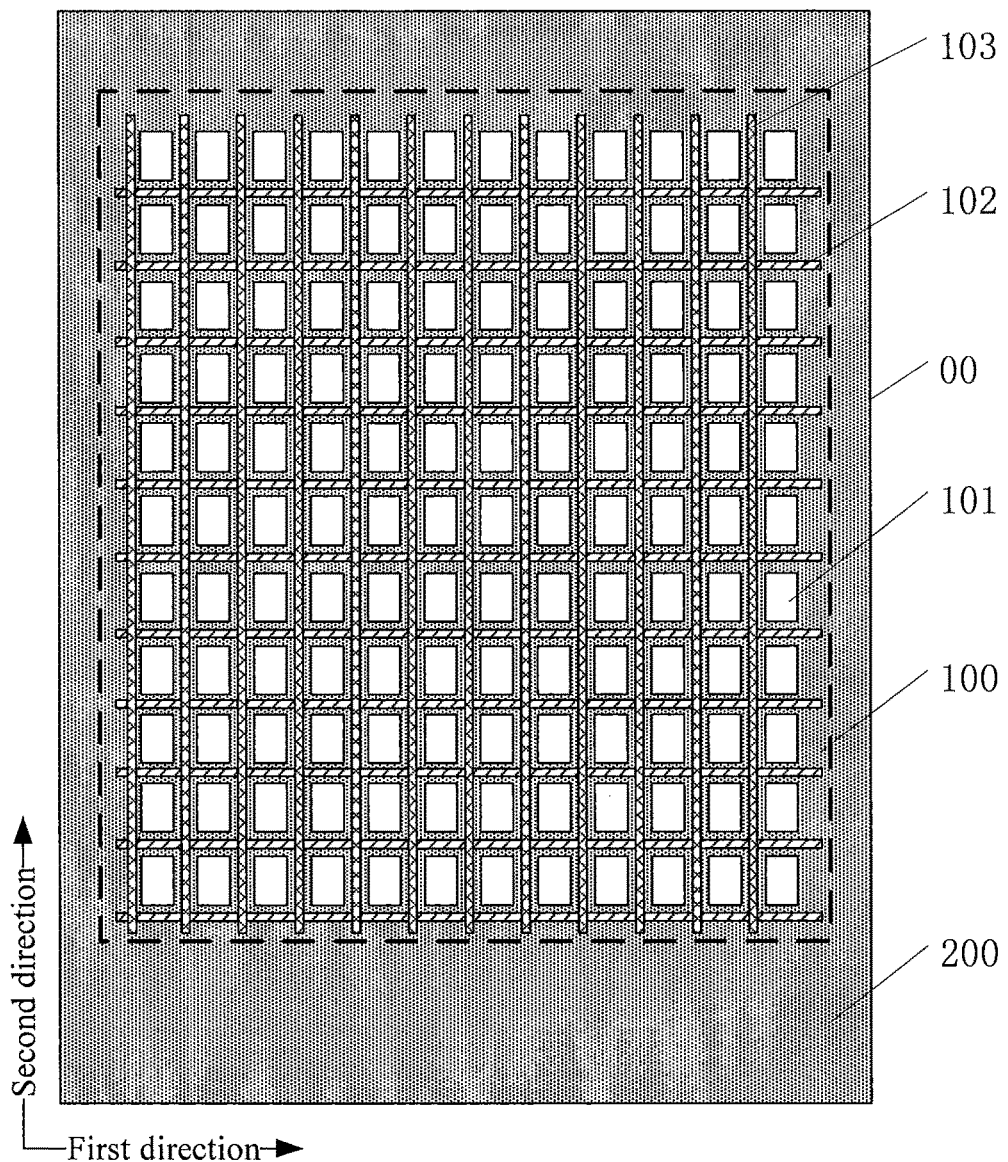
FIG. 8 is a schematic plan diagram showing another flexible display substrate according to an embodiment of the present disclosure.

In some alternative implementations, reference is made to FIG. 8, which is a schematic plan diagram showing another flexible display substrate according to an embodiment of the present disclosure. The flexible display substrate provided by the present embodiment has a display region 100 including a plurality of pixel units 101, and a peripheral region 200 adjacent to the display region 100. The flexible display substrate further includes a substrate 00, and further includes a plurality of gate lines 102 extending along a first direction and being arranged along a second direction, and a plurality of data lines 103 extending along the second direction and being arranged along the first direction. The gate lines 102 and the data lines 103 intersect in an insulation manner to define the pixel units 101. In the embodiments of the present disclosure, the first conductive portions 11 in the conductive wire 10 and the gate lines 102/the data lines 103 are disposed in the same layer. That is, the first conductive portions 11 in the conductive wire 10 provided by the embodiments of the present disclosure and the gate lines 102 may be formed in the same process. Alternatively, the first conductive portions 11 in the conductive wire 10 provided by the embodiments of the present disclosure and the data lines 103 may be formed in the same process. Alternatively, the conductive wire 10 is electrically connected with the gate lines 102 or the data lines 103.

Figure 9:
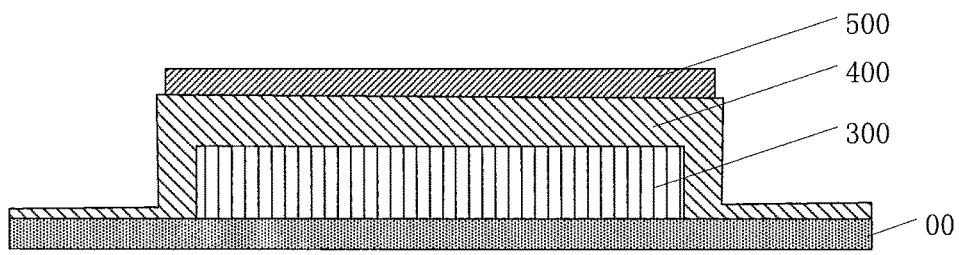
FIG. 9 is a schematic cross-sectional diagram showing the flexible display substrate shown in FIG. 2.
Figure 10:
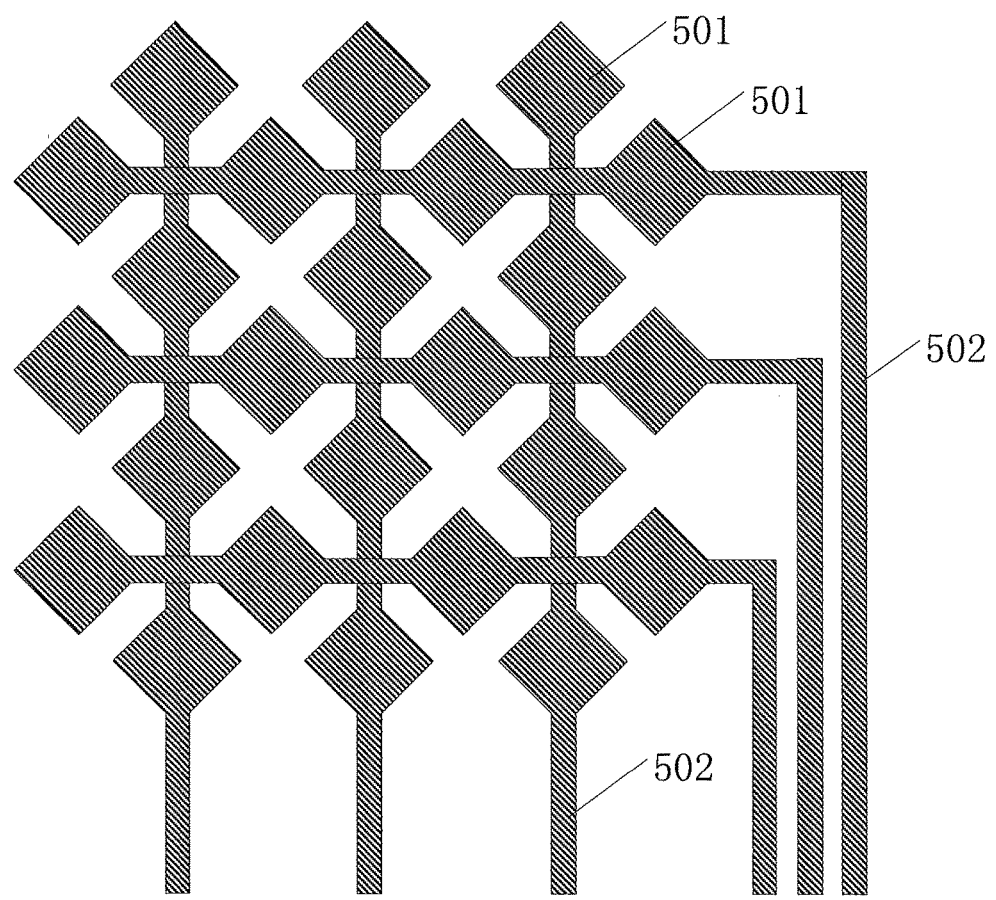
FIG. 10 is a schematic plan diagram showing a touch layer of the flexible display substrate shown in FIG. 9.

In some alternative implementations, reference is made to FIG. 9, which is a schematic cross-sectional diagram showing the flexible display substrate as shown in FIG. 9. In combination with FIG. 9 and FIG. 2, the flexible display substrate provided by the present embodiment has a display region 100 including a plurality of pixel units 101, and a peripheral region 200 adjacent to the display region 100. The flexible display substrate provided by the present embodiment further includes a display functional layer 300 disposed on the substrate 00; an encapsulation layer 400 disposed on a side, which is facing away from the substrate 00, of the display functional layer 300; and a touch layer 500 disposed on a side, which is facing away from the substrate 00, of the encapsulation layer 400. The display functional layer 300 is used to display image information, and for example, may be an organic light emitting diode array. The encapsulation layer 400 covers the display functional layer 300 for isolating the display functional layer 300 from the air to prevent moisture and oxygen in the air from eroding the display functional layer 300. The encapsulation layer 400 may be a single layer structure, or may be of a multi-layer structure. The touch layer 500 is used to detect information regarding touch operations. The touch layer provided by the related art can detect position information of the touch operation, and size information of a pressure of the touch operation. The touch layer generally includes a touch electrode and a touch electrode lead for transmitting the electrical signal to the touch electrode. A working mode of the touch layer can include a self-capacitance mode or a mutual-capacitance mode. The principle of the self-capacitance type touch layer is as follows: a change in the electrical signal caused by a change in the ground capacitance of the touch electrode is detected and analyzed when a touch operation occurs, so as to determine information regarding the touch operation. The principle of the mutual-capacitance type touch layer is as follows: a change in the electrical signal of at least one touch electrode caused by a change in capacitance between at least two touch electrodes is detected and analyzed when the a touch operation occurs, so as to determine information regarding the touch operation. Reference is made to FIG. 10, which is a schematic plan diagram showing the touch layer of the flexible display substrate as shown in FIG. 9. The touch layer 500 includes a plurality of touch electrodes 501 and touch electrode leads 502. The conductive wires 10 provided by the embodiments of the present disclosure are also used as the touch electrode leads 502. In the touch layer 500 provided by the embodiment of FIG. 10, only one arrangement of the touch electrodes and the touch electrode leads is shown, and the structure of the touch layer 500 of the present embodiment is not particularly limited.

It is to be noted that, in some alternative implementations, in the conductive wires 10 provided by the embodiments of the present disclosure, the first conductive portions 11 are made of a metal, such as aluminum, titanium, chromium and molybdenum, and the second conductive portion 12 is made of a conductive polymeric material. Alternatively, the second conductive portion 12 is made of at least one of PEDOT (poly(3, 4-ethylenedioxythiophene)), ethylenedioxythiophene, and polystyrene sulfonic acid. Alternatively, the first conductive portion 11 is cuboid-shaped, and the first conductive portions 11 in the conductive wires 10 are the same or different in volumes.

Figure 11:
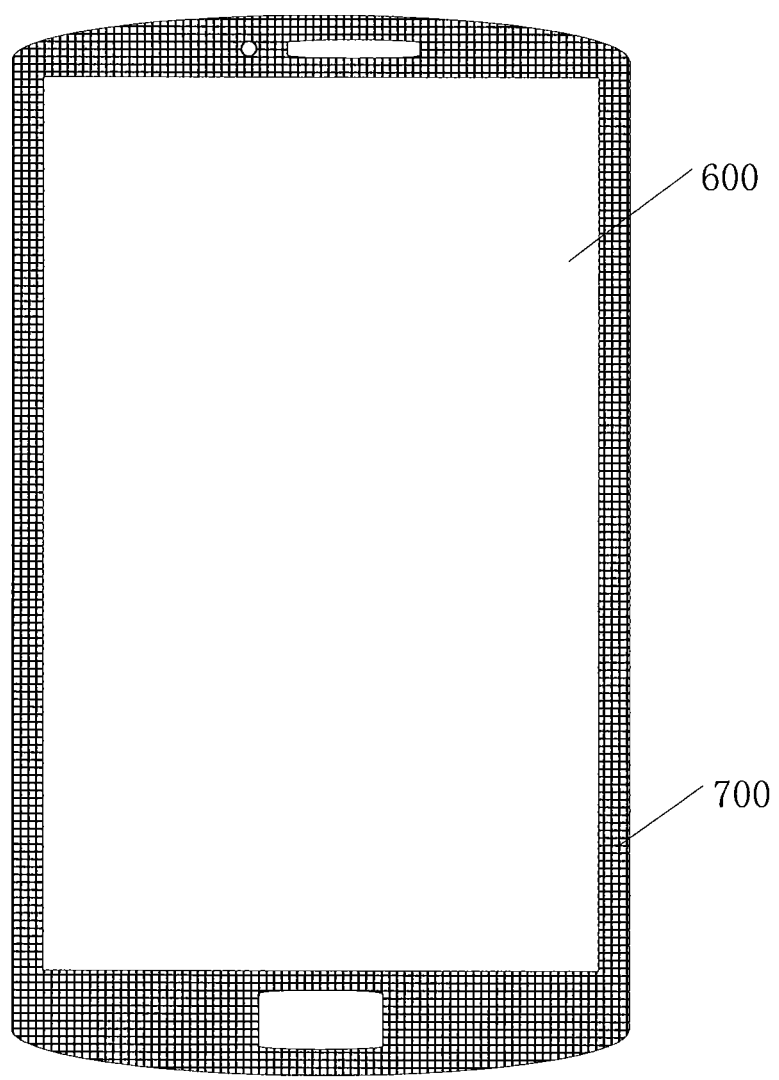
FIG. 11 is a schematic plan diagram showing a flexible display apparatus according to an embodiment of the present disclosure.

An embodiment of the present disclosure further provides a flexible display apparatus. Reference is made to FIG. 11, which is a schematic plan diagram showing a flexible display apparatus according to an embodiment of the present disclosure. The flexible display apparatus provided by the present embodiment includes a flexible display substrate 600 and a housing 700, where the flexible display substrate 600 is the flexible display substrate provided by any one of the embodiments of the present disclosure. The flexible display substrate includes a display region including a plurality of pixel units, and a peripheral region adjacent to the display region. The flexible display substrate further includes a substrate and at least one conductive wire disposed on the substrate. The conductive wire includes at least two first conductive portions and at least one second conductive portion, and two adjacent first conductive portions are electrically connected through the second conductive portion. The Young's modulus of the first conductive portions is greater than that of the second conductive portion and the resistivity of the first conductive portions is less than that of the second conductive portion. The flexible display apparatus provided by the embodiment of the present disclosure has the advantageous effects of the flexible display substrate provided by the embodiments of the present disclosure, which may refer to the flexible display substrate provided by the above-described embodiment and will be omitted herein. The display apparatus may be any device with a display function, such as a mobile phone, a desktop computer, a notebook, a tablet computer, an electronic paper, or the like.

The foregoing is a further detailed description of the present disclosure in connection with specific preferred embodiments, and it is not to be deemed that the specific implementation of the present disclosure is limited to these illustrations. It will be apparent to those skilled in the art to which the present disclosure pertains that various modifications or substitutions may be made without departing from the spirit of the present disclosure, and should be considered as falling within the protective scope of the present disclosure.

What is claimed is:

1. A flexible display substrate, comprising a display region having a plurality of pixel units and a peripheral region adjacent to the display region, wherein the flexible display substrate further comprises:
   a substrate;
   at least one conductive wire disposed on the substrate;
   wherein each conductive wire comprises at least two first conductive portions and at least one second conductive portion,
   wherein the first conductive portions are disposed discontinuously and separated from each other, and two adjacent first conductive portions are electrically connected through the second conductive portion; and
   wherein a Young's modulus of the first conductive portions is greater than that of the second conductive portion, and resistivity of the first conductive portions is less than that of the second conductive portion.

2. The flexible display substrate according to claim 1, wherein the first conductive portions are made of metals.

3. The flexible display substrate according to claim 1, wherein the second conductive portion comprises conductive polymeric material.

4. The flexible display substrate according to claim 3, wherein the second conductive portion comprises at least one of PEDOT (poly(3, 4-ethylenedioxythiophene)), ethylendioxythiophene and polystyrene sulfonic acid.

5. The flexible display substrate according to claim 1, wherein each conductive wire comprises only one second conductive portion, the second conductive portion is disposed on a side, which is facing away from the substrate, of the first conductive portions, and the second conductive portion is arranged to cover the at least two first conductive portions.

6. The flexible display substrate according to claim 5, further comprising at least one third conductive portion, wherein the third conductive portion is disposed on a surface at a side, which is facing away from the first conductive portions, of the second conductive portion, the Young's modulus of the third conductive portion is greater than that of the second conductive portion, and the resistivity of the third conductive portion is less than that of the second conductive portion; wherein
in a direction perpendicular to the substrate, each third conductive portion is intersected with two adjacent first conductive portions; and
the second conductive portion between the third conductive portion and the first conductive portions intersected with the third conductive portion has a thickness d1 in the direction perpendicular to the substrate, and the second conductive portion between two adjacent first conductive portions has a thickness d2 in a direction parallel to the substrate, wherein d1 is less than d2.

7. The flexible display substrate according to claim 5, further comprising at least one third conductive portion, wherein the third conductive portion is disposed on a surface at a side, which is facing away from the first conductive portions, of the second conductive portion, the Young's modulus of the third conductive portion is greater than that of the second conductive portion, and the resistivity of the third conductive portion is less than that of the second conductive portion; wherein
an orthographic projection of the third conductive portion on the substrate is between orthographic projections of two adjacent first conductive portions on the substrate; and
the second conductive portion between the third conductive portion and the first conductive portions adjacent to the third conductive portion has a thickness d1 in a direction perpendicular to the substrate, and the second conductive portion between two adjacent first conductive portions has a thickness d2 in a direction parallel to the substrate, wherein d1 is less than d2.

8. The flexible display substrate according to claim 6, wherein a material of the third conductive portion and that of the first conductive portions are the same.

9. The flexible display substrate according to claim 7, wherein a material of the third conductive portion and that of the first conductive portions are the same.

10. The flexible display substrate according to claim 1, wherein each second conductive portion is electrically connected with two adjacent first conductive portions and insulated from other first conductive portions.

11. The flexible display substrate according to claim 10, wherein each conductive wire comprises a plurality of first conductive portions and a plurality of second conductive portions.

12. The flexible display substrate according to claim 10, wherein each of the first conductive portions comprises at least one conductive contact surface, and the conductive contact surface is in contact with the second conductive portion; and
the conductive contact surfaces of the at least two first conductive portions are the same or different in areas.

13. The flexible display substrate according to claim 1, wherein the first conductive portions are cuboid-shaped.

14. The flexible display substrate according to claim 1, wherein the at least two first conductive portions have the same volume.

15. The flexible display substrate according to claim 1, wherein the flexible display substrate comprises a plurality of conductive wires with the same equivalent resistance.

16. The flexible display substrate according to claim 1, further comprising:
a plurality of gate lines extending along a first direction and arranged along a second direction;
a plurality of data lines extending along the second direction and arranged along the first direction; and
the gate lines and the data lines are intersected and insulated from each other to define the pixel units;
wherein the first direction is a horizontal direction, and the first direction and the second direction are orthogonal to each other, and the first conductive portions are disposed at the same layer as the gate lines.

17. The flexible display substrate according to claim 1, further comprising:
a plurality of gate lines extending along a first direction and arranged along a second direction;
a plurality of data lines extending along the second direction and arranged along the first direction; and
the gate lines and the data lines are intersected and insulated from each other to define the pixel units;
wherein the first direction is a horizontal direction, and the first direction and the second direction are orthogonal to each other, and the first conductive portions are disposed at the same layer as the data lines.

18. The flexible display substrate according to claim 1, further comprising:
a display functional layer disposed on the substrate;
an encapsulation layer disposed on a side, which is facing away from the substrate, of the display functional layer; and
a touch layer disposed on a side, which is facing away from the substrate, of the encapsulation layer;
wherein the touch layer comprises a plurality of touch electrodes and a plurality of touch electrode leads, and the conductive wires are multiplexed as the touch electrode leads.

19. A flexible display apparatus, comprising:
a flexible display substrate; and
a housing,
wherein the flexible display substrate comprises a display region having a plurality of pixel units, and a peripheral region adjacent to the display region;
wherein the flexible display substrate further comprises a substrate and at least one conductive wire disposed on the substrate;
wherein each conductive wire comprises at least two first conductive portions and at least one second conductive portion, the first conductive portions are disposed discontinuously and separated from each other, and two adjacent first conductive portions being electrically connected through the second conductive portion; and wherein a Young's modulus of the first conductive portions is greater than that of the second conductive portion, and resistivity of the first conductive portions is less than that of the second conductive portion.

* * * * *